United States Patent [19]

Mucke

[11] Patent Number: 5,304,948
[45] Date of Patent: Apr. 19, 1994

[54] RF AMPLIFIER WITH LINEAR GAIN CONTROL

[75] Inventor: Lars H. Mucke, San Diego, Calif.

[73] Assignee: Nokia Mobile Phones Ltd., Salo, Finland

[21] Appl. No.: 989,116

[22] Filed: Dec. 11, 1992

[51] Int. Cl.[5] .............................................. H03G 3/30
[52] U.S. Cl. ...................................... 330/284; 330/145
[58] Field of Search .............. 330/145, 284; 333/81 R; 307/559, 561, 565

[56] References Cited

U.S. PATENT DOCUMENTS

3,534,278  10/1970  Bootmann ...................... 330/284 X
3,634,775  1/1972  Ulmer et al. ........................ 330/284

*Primary Examiner*—James B. Mullins
*Attorney, Agent, or Firm*—Perman & Green

[57] ABSTRACT

A circuit amplifies an input RF band of signals and exhibits a signal gain in decibels that is a linear function of the logarithm of a control signal input. The circuit comprises a first amplifier stage having an output node that exhibits a first RF complex admittance within the RF band of signals. A second amplifier stage has an input node coupled to the output node of the first amplifier stage and exhibits a second RF complex admittance within the RF band of signals. A PIN diode, used as a gain control element, is shunt connected between the control signal input and the output node. An RF reactance circuit is also shunt connected between the output node and a common potential. The RF reactance circuit has a third admittance that is chosen to negate the imaginary portions of the first and second complex admittances, whereby the total admittance is substantially real and enables the PIN diode to see a minimal resistive load.

8 Claims, 2 Drawing Sheets

RF AMPLIFIER WITH LINEAR GAIN CONTROL

FIELD OF THE INVENTION

This invention relates to radio frequency (RF) amplifiers and, more particularly, to a radio frequency amplifier exhibiting a linear gain control characteristic over a band of expected RF frequencies.

BACKGROUND OF THE INVENTION

Various gain control techniques are known for radio frequency and intermediate frequency amplifiers. As the use of portable communications equipment has increased (e.g., cellular telephones), it has become important to implement such gain control techniques using a minimum of circuitry so as to reduce cost and device weight.

In certain applications, it is important to be able to predict the gain of an RF amplifier strictly through knowledge of a control signal. Gain, in such circuits, is generally expressed in decibels (dB) as follows:

$$Gain = (a)\log(CONTROL) + b \qquad (1)$$

Where:
CONTROL is measured in volts or amperes; and
a and b are constants.

Linear gain control in such circuits has been implemented through the use of a multiplier that employs a differential transistor amplifier structure. Such an arrangement requires many matching transistors and is practical only when implemented as a monolithic integrated circuit. Others have implemented linear gain control through the use of a compensation circuit which, in response to a control signal, modifies the transfer characteristic of an RF amplifier so as to negate its nonlinearities. Such a circuit is shown in U.S. Pat. No. 5,099,204 to Wheatley, III.

A variety of prior art amplifiers employ PIN diodes for gain control. A PIN diode is a three layer device consisting of an intrinsic high resistance layer in the center, with conducting P and N layers on either side. The intrinsic layer's RF resistance can be controlled by a DC bias current and is approximately proportional to the inverse of the current. The RF resistance ($R_{RF}$) of a PIN diode is:

$$R_{RF} = \frac{V_o}{I_c^\alpha} \qquad (2)$$

Where:
$V_o$ and $\alpha$ are constants
$I_c$ is the dc current in the PIN diode "Communications Receivers", Ulrich L. Rohde, T.T.N. Bucher, McGraw-Hill, 1988, pages 235–41, describe various applications of PIN diodes for amplifier gain control. In one version (page 237), a pair of PIN diodes control the impedance of a common emitter circuit in an emitter coupled RF amplifier. In another version (page 239), three PIN diodes are employed as a variable attenuator between amplifier stages. In "Practical Variable Gain Amplifiers", Franklin, RF Expo West '92, pages 41–54, a number of PIN diode attenuators are shown used as variable gain controls for RF amplifiers. Various diode attenuator topologies are disclosed including series, shunt, Tee, bridge and bridge/Tee configurations. Similar configurations are employed in commercially available RF amplifiers, i.e., the AGC-330, Voltage-Controlled AGC Amplifier, marketed by Avantek, 481 Cottonwood Drive, Milpitas, Calif. 95035. The AGC-330 Amplifier employs a double-T arrangment wherein the PIN diodes are separated by a resistor in the signal feed path.

In the above noted gain control configurations, known PIN diode characteristics are employed to provide gain control functions for RF amplifiers without consideration given to gain control linearity. They do not take into account the affect of complex impedances that vary the gain control effect of the PIN diode (or diodes). Those impedances cause the gain of an amplifier to vary in other than in a linear fashion in response to an applied control voltage.

Accordingly, it is an object of this invention to provide a linear gain control circuit for an RF amplifier.

It is a further object of this invention to provide a linear gain control circuit that operates under conditions of complex impedance Variations within a narrow band of applied RF frequencies.

It is another object of this invention to provide a linear gain control circuit for an IF amplifier that is both simple and requires no special matched devices.

SUMMARY OF THE INVENTION

A circuit amplifies an input RF band of signals and exhibits a signal gain in decibels that is a linear function of the logarithm of a control signal input. The circuit comprises a first amplifier stage having an output node that exhibits a first RF complex admittance within the RF band of signals. A second amplifier stage has an input node coupled to the output node of the first amplifier stage and exhibits a second RF complex admittance within the RF band of signals. A PIN diode is shunt connected between the control signal input and the output node. An RF reactance circuit is also shunt connected between the output node and a common potential. The RF reactance circuit has a third admittance that is chosen to negate the imaginary portions of the first and second complex admittances, whereby the total admittance is substantially real and is much smaller than the real part of the PIN diode admittance.

DETAILED DESCRIPTION OF THE INVENTION

Figure 1:
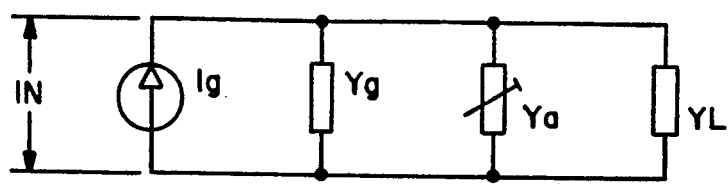
FIG. 1 is a simplified circuit showing the basic operation of a shunt gain control circuit.

The gain control circuit of this invention operates linearly over a limited frequency range. As such, it is useful as an intermediate frequency gain control in a radio transceiver. In FIG. 1, a simplified circuit is shown of the gain control system wherein Ig and Yg represent the output current and admittance of a signal source. Ys is a controllable, variable shunt admittance and YL represents input admittance of the load of the next following circuit. This circuit is an AC equivalent of any gain control circuit that exhibits shunt gain control. The transfer function of the circuit of FIG. 1 is:

$$V/Ig = 1/(Yg + Ys + YL) \qquad (3)$$

Where: admittances Yg, Ys and YL are complex admittances.

If Yg and YL are not much smaller than Ys, the shunt admittance Ys will not provide a linear gain function. However, if Yg and YL are much smaller than Ys, especially within a limited frequency range, then variations in Ys can be used to obtain a substantially linear gain control:

$$V/Ig \approx 1/Ys, \text{ if } Ys = V_o/I_c^a \text{ then} \qquad (4)$$

$$V/Ig = 1/V^o \cdot I_c^a$$

A device exhibiting an admittance Ys within a limited RF range may be configured as a PIN diode, in combination with a reactive tuned circuit. The tuned circuit is specifically designed to be resonant, in combination with all other reactances that can be seen from the tuned circuit, within the narrow IF band frequency range. Thus, when Yg and YL are much smaller than Ys, variation of impedance of the PIN diode enables linear shunting of a signal to a common potential (e.g. ground).

Figure 2:
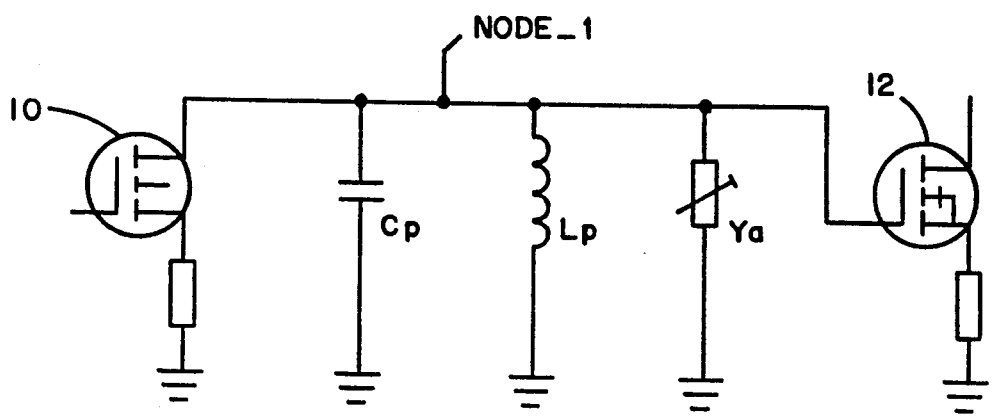
FIG. 2 is an AC equivalent of the circuit of FIG. 3.

An AC equivalent of a MOSFET circuit for accomplishing the invention is shown in FIG. 2. Inductance Lp and capacitance Cp form a tuned circuit in combination with the output admittance of MOSFET 10 and the input admittance of MOSFET 12. Shunt impedance Ys represents the shunt admittance of a PIN diode. The values of Lp and Cp are chosen so that the imaginary part of the admittance at node 1 is 0, or approximately 0, at the amplifier's operating center frequency. In this way, the imaginary parts of Yg, Ys and YL are cancelled. Because MOSFETS 10 and 12 are employed, the admittance real parts of Yg and YL are small compared with normally used values of the real part of Ys, so long as feedback capacitance of MOSFET 10 is small.

Figure 3:
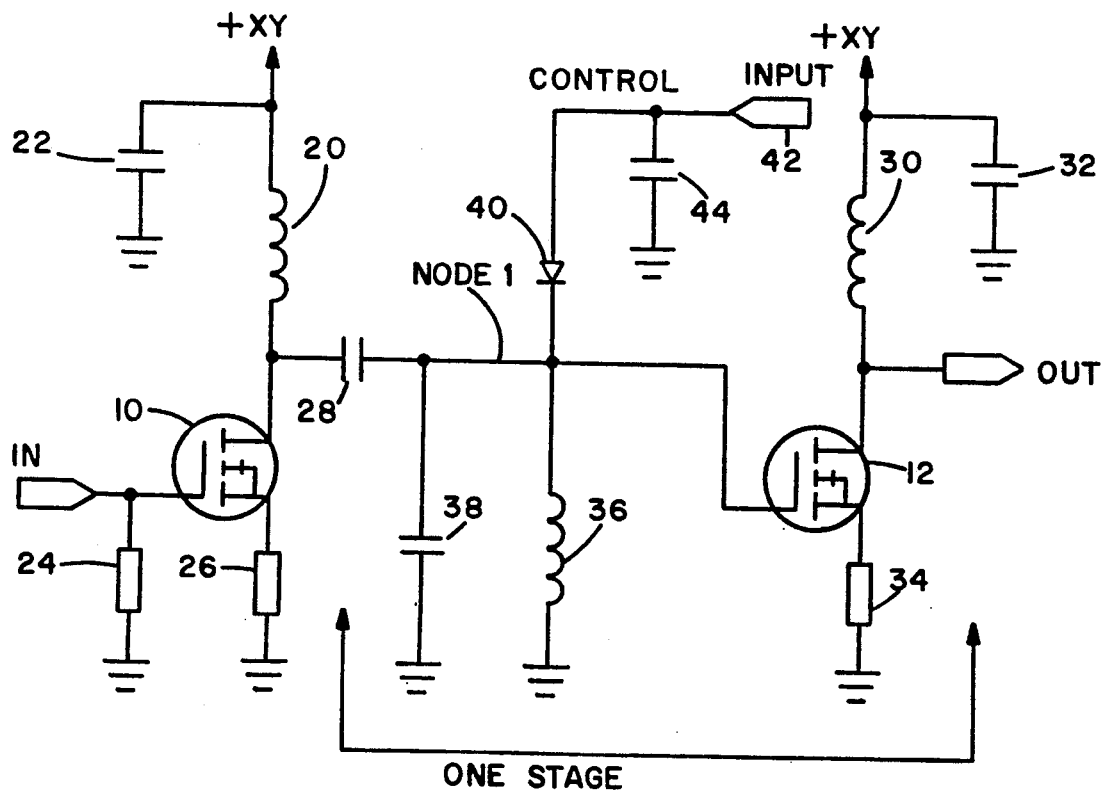
FIG. 3 shows a MOSFET embodiment that employs the shunt gain control of the invention.

A circuit is shown in FIG. 3 for implementing linear shunt gain control in accordance with the invention and employs a pair of MOSFET amplifier stages. A first amplifying stage includes MOSFET 10 which is connected to a bias supply via an inductor 20. A decoupling capacitor 22 shunts inductor 20 to a common potential. Resistors 24 and 26 serve to provide appropriate biases to MOSFET 10. Capacitor 28 couples the drain of MOSFET 10 to node 1.

A second stage of amplification includes MOSFET 12 whose drain is connected to a bias supply through an inductor 30 which is, in turn, shunted by a decoupling capacitor 32. A bias resistor 34 provides an appropriate bias level for MOSFET 12. Shunting node 1 is an inductor 36 and a capacitor 38 whose values are chosen, in combination with the complex admittances seen from MOSFETS 10 and 12 to resonate at the center frequency of the IF band that is to be amplified by the circuit. Thus, at the center IF frequency, all impedances/admittances seen at node 1 are resistive.

A PIN diode 40 is connected to node 1 and receives a DC control signal from control input 42. Capacitor 44 provides a decoupling function between PIN diode 40 and control input 42. By varying the DC current through PIN diode 40, the shunt RF resistance is varied between node 1 and ground and modifies the signal feed between the output of MOSFET 10 and the gate of MOSFET 12. Since the resistance of diode 40 varies as shown in equation 2 a substantially linear gain control within the IF frequency band results, as shown in equation 1.

Figure 4:
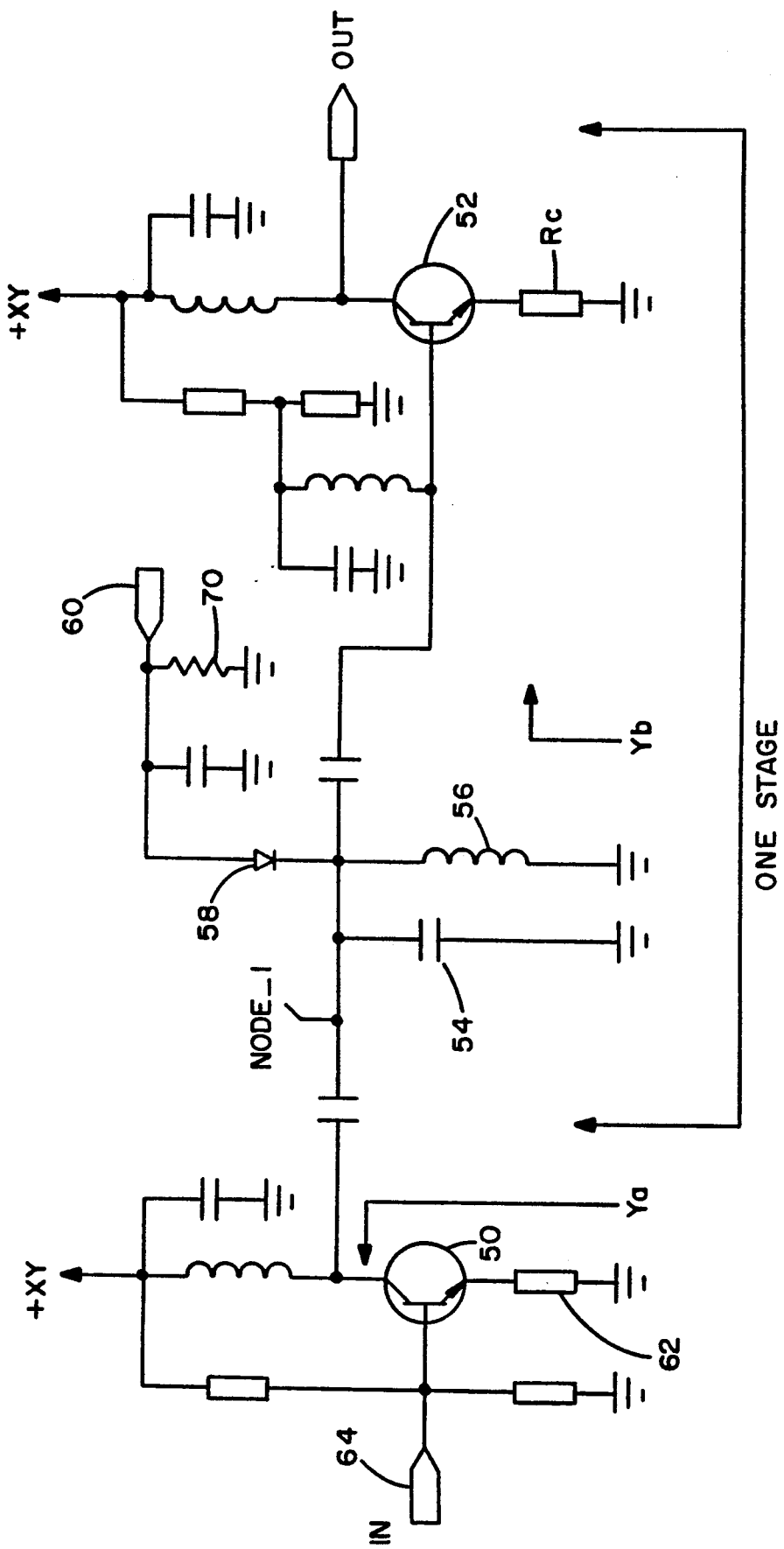
FIG. 4 is a bipolar transistor embodiment that employs the shunt gain control of the invention.

Turning to FIG. 4, a bipolar transistor configuration of the invention is shown. Transistors 50 and 52 are NPN bipolar devices. The bias circuits for transistors 50 and 52 are conventional. The gain control circuit comprises capacitor 54, inductor 56 and PIN diode 58, with a DC control current being applied via control input 60. The values of capacitor 54 and inductor 56 are chosen so that the imaginary part of admittances as seen from node 1 to ground are 0 at the operating center frequency. Reactive devices 54 and 56 thereby act to cancel the imaginary portions of the admittance Yc seen at the output of transistor 50 and of the admittance Yb at the input to the base of transistor 52, as well as the imaginary portion of the admittances of reactive devices 54, 56 and diode 58.

Admittance Yc seen at the collector of transistor 50 is ordinarily small compared with normally used values of the real part of Ys. In addition, the admittance Yb at the base of transistor 52 can be made small by using a transistor having a high current gain and an $f_t$ that is much higher than the operating frequency. In such case, the real part of Yb will be approximately:

$$real\ (Yb) = 1/(beta)(R_e)$$

where:
  beta is the current gain of transistor 52; and
  $R_e$ is the emitter resistance.

By choosing an appropriate value of $R_e$, the real pat of admittance Yb will be small when compared with the real part Ys.

If several stages are used in cascade, the admittance due to the capacitance between the base and collector of transistors 50 and 52 should be small compared with the real part of the shunt admittance Ys. Otherwise Yc and Yb are subject to change due to a lack of isolation. The value of emitter resistor 62 connected to the emitter of transistor 50 can be chosen to have a small value since input 64 is not connected to the shunt regulation circuit.

When shunt admittance Ys is small, the gain control linearity of the circuit deteriorates. This is due to the fact that as the admittance Ys approaches that of Yc and Yb, a parallel loading of the shunt circuit occurs. This nonlinearity commences when the control current (Id) through PIN diode 58 becomes small. If, however, the control current Id decreases in a nonlinear fashion, the loading effects of Yc and Yb can, approximately, be compensated. This is accomplished by setting the current Id for PIN diode 58 as follows:

$$Id = I(Control) - Io$$

Where:
  I(Control) is the control current inserted at terminal 60; and
  Io is a small, fixed offset current.

Approximate linearity is achieved through the use of offset current Io. Offset current Io is achieved by shunting control input 60 to a common potential with a resistance 70. Thus, input current I(control) flowing into control input 60 divides, with Io flowing in resistance 70 and Id flowing through diode 58. Since Io is much smaller than Id, in general it does not affect PIN diode 58. However, when I(Control) approaches Io, Io performs an offset function and causes an earlier decrease in the admittance of PIN diode 58 than would otherwise occur. Because the dc voltage $V_{PIN}$ across PIN diode 58 is approximately constant, the offset current Io is given by $$Io = V_{PIN}/R_{70}$$

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A circuit for amplifying an input radio frequency (RF) band of signals, wherein signal gain in decibels (dB) is a linear function of the logarithm of a control signal, said circuit comprising:
   a first transistor amplifier stage having an output node exhibiting a first RF complex admittance within said frequency band of signals;
   a second transistor amplifier stage having a control electrode, a second electrode coupled to a power supply and a third electrode coupled through a resistance to a common potential, said control electrode coupled to said output node and exhibiting a second RF complex admittance within said frequency band of signals;
   PIN diode means connected between a control signal input and said output node and responsive to a control signal to reflect a given RF admittance, said PIN diode means further connected via an RF path to said common potential; and
   RF reactance means shunt connected with respect to said PIN diode means, between said common potential and said output node, said RF reactance means having a third RF complex admittance that is chosen to negate imaginary portions of said first and second complex admittances, whereby any admittance seen by said PIN diode means is substantially real within said frequency band of signals.

2. The circuit as described in claim 1 wherein variations in said control signal input act to vary the RF resistance of said PIN diode means to thereby shunt portions of said radio frequency band of signals to said common potential, said variation resulting in a linear change of gain.

3. The circuit as described in claim 2 wherein said RF reactance means comprises a parallel connected inductor/capacitor pair.

4. The circuit as described in claim 3 wherein said given RF admittance of said PIN diode means is much larger than either of said first or second RF complex admittances.

5. The circuit as recited in claim 2 further comprising a resistance connecting said PIN diode means to said common potential and providing a constant current path for a first portion of said control signal, said control signal input being a dc current and having a second portion that is variable, such that when said variable portion is small and changes therein occur, said PIN diode means experiences a change in admittance through combined effects of said first portion and second portion of said control signal that offsets nonlinearities in gain control that result from any admittances seen by said PIN diode means.

6. The circuit as described in claim 1 wherein said first and second amplifier stages comprise MOSFET transistors, with a terminal of a MOSFET transistor in said first amplifier stage being in RF communication with a gate of a MOSFET transistor in said second amplifier stage, both said MOSFETS exhibiting real part admittances that are small in relationship to a real part admittance exhibited by said PIN diode means.

7. The circuit as recited in claim 1 wherein said first and second amplifier stages comprise bipolar transistors, a bipolar transistor in said first amplifier stage having its collector in RF communication with a base of a bipolar transistor in said second amplifier stage, said bipolar transistors exhibiting a small base to collector feedback capacitance.

8. The circuit as recited in claim 7 wherein said bipolar transistor in said second amplifier stage has its emitter connected via said resistance to said common potential, the value of said resistance, in combination with a beta value for said second transistor, acting to create a low input admittance at the base of said bipolar transistor in said second amplifier circuit.

* * * * *